United States Patent [19]

Maier

[11] Patent Number: 4,736,456
[45] Date of Patent: Apr. 5, 1988

[54] TUNING SYSTEM FOR TELEVISION SETS

[75] Inventor: Gerhard Maier, Dauchingen, Fed. Rep. of Germany

[73] Assignee: Deutsche Thomson-Brandt GmbH, Villingen-Schwenningen, Fed. Rep. of Germany

[21] Appl. No.: 948,346

[22] PCT Filed: Apr. 2, 1986

[86] PCT No.: PCT/EP86/00201
§ 371 Date: Dec. 2, 1986
§ 102(e) Date: Dec. 2, 1986

[87] PCT Pub. No.: WO86/06235
PCT Pub. Date: Oct. 23, 1986

[30] Foreign Application Priority Data

Apr. 11, 1985 [DE] Fed. Rep. of Germany ....... 3512873

[51] Int. Cl.$^4$ ............ H04B 1/26; H04B 11/16; H04N 5/50
[52] U.S. Cl. .................. 455/164; 455/191; 455/192; 455/197; 455/182; 358/191.1
[58] Field of Search ........... 455/182, 183, 184, 191, 455/192, 193, 291, 186, 164, 197, 180, 195, 188, 340, 166; 358/191.1, 195.1

[56] References Cited

U.S. PATENT DOCUMENTS

| | | | |
|---|---|---|---|
| 4,270,220 | 5/1981 | Hagiwara et al. | 455/186 |
| 4,334,323 | 6/1982 | Moore | 455/186 |
| 4,402,089 | 8/1983 | Knight et al. | 455/186 |
| 4,476,583 | 10/1984 | Muterspaugh | 455/340 |
| 4,481,673 | 11/1984 | Muterspaugh | 455/186 |
| 4,590,611 | 5/1986 | Maier | 455/183 |
| 4,658,437 | 4/1987 | Ersoz et al. | 455/197 |
| 4,685,150 | 8/1987 | Maier | 455/197 |

Primary Examiner—Robert L. Griffin
Assistant Examiner—Curtis Kuntz
Attorney, Agent, or Firm—Max Fogiel

[57] ABSTRACT

An automatic alignment system for the tuner of a television receiver with a controlled high-frequency preamplifier stage and an intermediate-frequency amplifier that has a reference circuit with a resonance frequency that can be switched to the arithmetic mean between the video-carrier intermediate frequency and the audio-carrier intermediate frequency during automatic alignment. The maximum control voltage is employed as a criterion for optimum alignment and an auxiliary oscillator is switched on during automatic alignment and generates through a mixing stage an auxiliary frequency that corresponds to the arithmetic mean of the video-carrier frequency and the audio-carrier frequency from the tuner-oscillator frequency.

2 Claims, 2 Drawing Sheets

TUNING SYSTEM FOR TELEVISION SETS

BACKGROUND OF THE INVENTION

The point of departure for the invention is an automatic alignment system for the tuner of a television receiver with a controlled high-frequency preamplifier stage and an intermediate-frequency amplifier that has a reference circuit with a resonance frequency that can be switched to the arithmetic mean between the video-carrier intermediate frequency and the audio-carrier intermediate frequency during automatic alignment, whereby the maximum control voltage is employed as a criterion for optimum alignment and an auxiliary oscillator is switched on during automatic alignment and generates through a mixing stage an auxiliary frequency that corresponds to the arithmetic mean of the video-carrier frequency and the audio-carrier frequency from the tuner-oscillator frequency, and the automatic alignment occurs in that tuning-voltage values are sequentially applied in digital steps subject to microprocessor control through digital-to-analog converters to the capacity diodes in the high-frequency tuning circuits and the increase in the tuning-voltage values is discontinued when a maximum control voltage is attained, with the detected tuning-voltage value being retained in the activated digital-to-analog converter.

A tuner is described in German OS No. 2 854 852 for example. It uses three auxiliary oscillators and their associated analog memories in conjunction with the PLL circuit to tune the high-frequency circuit to the desired reception frequency. This tuner also exploits the tuner oscillator for alignment. Furthermore, the number of auxilliary oscillators must equal that of the high-frequency circuits to be aligned. The number of auxiliary oscillators needed and hence the materials cost will then increase especially when for example a television receiver is being aligned and bands I, III, IV, and V are to be tuned, entailing the risk of ambiguities between the frequencies of the tuner oscillator and auxiliary oscillator and the reception frequencies. One drawback to the realization of these tuners is that the exciter windings in the auxilliary oscillators can in conjunction with the individual coils of the high-frequency circuits provoke undesirable resonances and attenuations in the circuitry that in turn occasion uncontrollable mistuning in the circuits when the auxiliary oscillators are switched off once the alignment is finished. The tuner also involves analog memories that must be recharged at intervals in order to maintain the optimum tuning values. Optimum alignment of the receiver is accordingly impossible in principle. Furthermore, the constantly repeated retuning results in disturbances that can be seen on the screen and heard in the loudspeaker.

The journal *Nachrichten Elektronik* 11 (1979), 365–68 describes a method of tuning radio receivers that also employs additional auxilliary circuits in the high-frequency filters. This method also results in deleterious effects on the circuits once the aligned receiver is in operation. As the left-hand and middle columns on page 367 say, precise tuning can only be attained by means of special components in the form of exactly paired diodes. This also entails a not inconsiderable expense.

A system of testing receivers is known from U.S. Pat. No. 3,736,512 that in on-line operation monitors the properties of the various stages of a receiver—the preamplifier, mixing stage, and intermediate-frequency amplifier for example. When deviations from reference values that are visually displayed are detected, they must be corrected by the operator of the receiver. This is not a closed system wherein high-frequency filter circuits are automatically optimally aligned for each reception channel.

SUMMARY OF THE INVENTION

The object of the invention is to create an alignment system that employs an auxilliary oscillator and is completely separated from the television-receiver antenna. It has the advantage that no special measures with respect to interference radiation are required, and it ensures that communications regulations are complied with.

The essentials of the invention will now be specified by means of one embodiment by way of example and with reference to the drawings.

DESCRIPTION OF THE PREFERRED EMBODIMENTS

Figure 1:
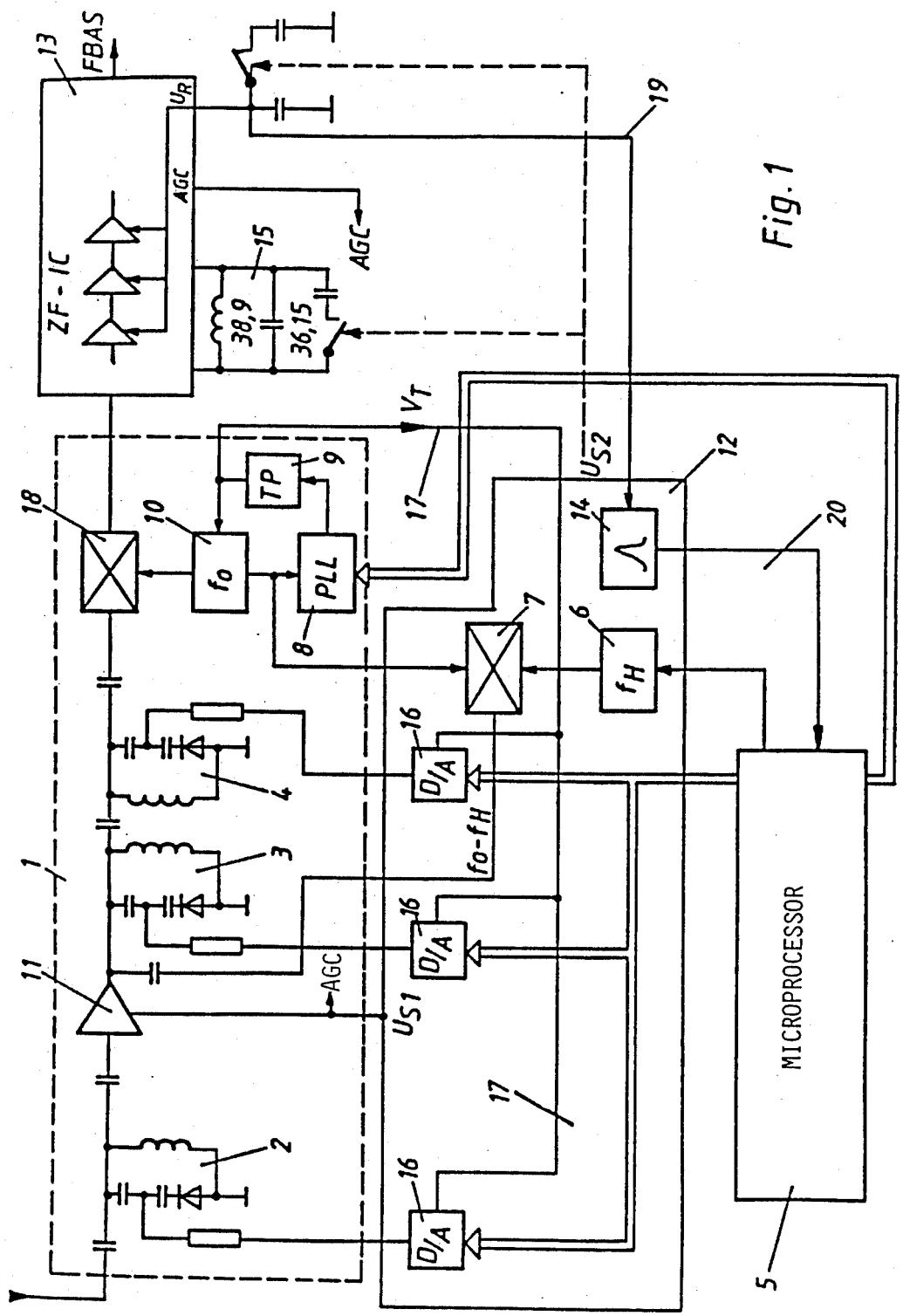
FIG. 1 is a block diagram illustrating the components essential to the automatic alignment system and FIG. 2 is a wave diagram illustrating the function.

FIG. 1 illustrates the tuner 1 of a television receiver. Its high-frequency filter circuits 2, 3, and 4 are to be automatically aligned by applying the corresponding direct-current tuning voltages to the capacity diodes that are part of the circuits. High-frequency band filter 3 and 4 is aligned first. To do this, an auxiliary oscillator 6 is, subject to microprocessor 5, switched on and, in conjunction with a mixing stage 7, exploits the oscillator frequency of the selected channel generated by a PLL loop 8 and 9 with a tuner oscillator 10 to supply a frequency that is a certain level below the oscillator frequency in the intermediate-frequency range, so that a mixing stage 18 for instance generates a frequency of 36.15 MHz. A high-frequency preamplifier 11 is deactivated by being decontrolled during the alignment of high-frequency band filter 3 and 4. This is achieved with an appropriate control voltage $U_{S1}$ from a control circuit 12. A reference circuit 15 in intermediate-frequency component 13 is switched over to the reference frequency (36.15 MHz) with $U_{S2}$ during the alignment. Furthermore, the capacity at the control-voltage output terminal of intermediate-frequency component 13, and hence the time constant, is decreased by switching off a capacitor. During optimum alignment the maximum of a control voltage is established at a $U_R$-output terminal. The control voltage is supplied through a line 19 to a processing circuit 14 in control circuit 12. Circuit 14 interrupts, through a line 20 to microprocessor 5, the further graduated variation in the tuning spanning. Once high-frequency band filter 3 and 4 has been aligned, auxiliary oscillator 6 is switched off, high-frequency preamplifier 11 is brought back to full control, and the frequency of tuner oscillator 10 is reduced by half the intermediate audio frequency (5.5 MHz). This means that, at the particular reference frequency that has been switched over to, the antenna-signal audio carrier will act as an auxilliary frequency. The particular tuner-oscillator tuning voltage that becomes established acts as a base voltage for digital-to-analog converters 16 and is supplied to them through a line 17. Once the alignment has been optimally completed, the tuner oscillator is returned to the frequency that corresponds to the channel, which tunes antenna circuit 2 to the mid-band.

Figure 2:
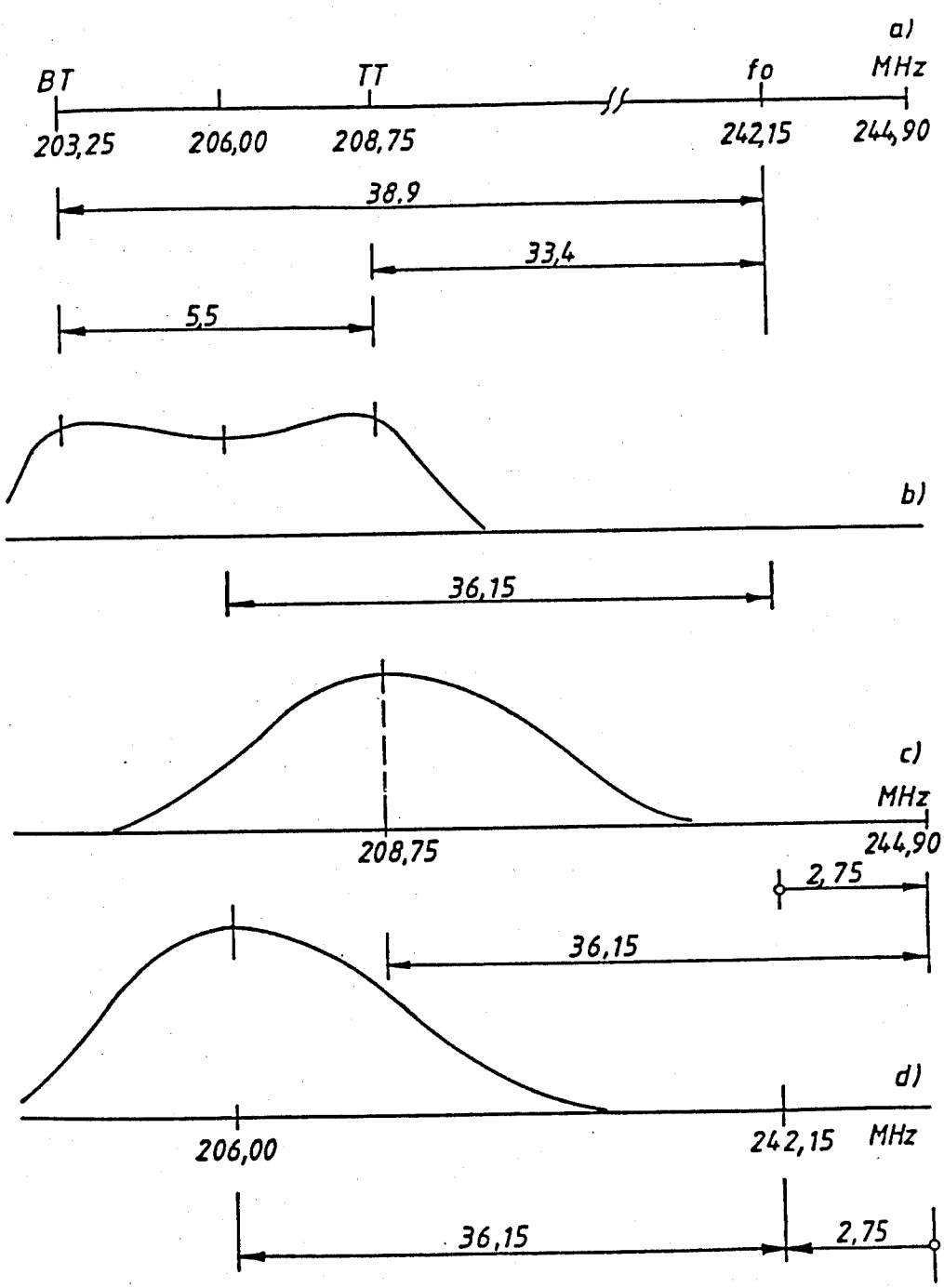

FIG. 2 illustrates an example of automatic alignment for television channel 9 in band III. The video carrier in this band is 203.25 MHz and the audio carrier 208.75 MHz. The tuner-oscillator frequency that is to be adjusted is 242.15 MHz (FIG. 2a). Mixing stage 7 supplies a frequency of 206 MHz, which lies in mid-channel between the video carrier and the audio carrier for automatic alignment of high-frequency band filter 3 and 4, employing auxiliary oscillator 6 (36.15 MHz).

FIG. 2b illustrates the high-frequency characteristic for band filter 3 and 4 subsequent to alignment, when auxiliary oscillator 6 turns off and the tuner oscillator is set 2.75 MHz higher—to 244.90 MHz. Since the reference circuit of the intermediate-frequency component continues to lie at the reference frequency of 36.15 MHz, antenna circuit 2 is now tuned to the audio-carrier frequency of 208.75 MHz (FIG. 2c). Once tuner oscillator 10 has been switched back to its intended frequency of 242.75 MHz, antenna circuit 2 will be precisely at 206 MHz (FIG. 2d).

I claim:

1. Automatic alignment apparatus for a tuner of a television receiver comprising: high-frequency tuning circuits with capacity diodes; a controlled high-frequency preamplifier stage and an intermediate-frequency amplifier with a reference circuit having a resonance frequency; means for switching said resonance frequency to an arithmetic mean between a video-carrier intermediate frequency and an audio-carrier intermediate frequency during automatic alignment, maximum control voltage being a criterion for optimum alignment; an auxiliary oscillator switched on during automatic alignment; a tuner oscillator with a tuner-oscillator frequency; a mixing stage, said tuner oscillator generating an auxiliary frequency through said mixing stage corresponding to the arithmetic mean of a video-carrier frequency and an audio-carrier frequency from said tuner-oscillator frequency; digital-to-analog conversion means, tuning voltage being sequentially applied in digital steps through said digital-to-analog conversion means and said capacity diodes for automatic alignment, increase in tuning-voltage values being discontinued when a maximum control voltage is attained and a detected tuning-voltage value being retained in said digital-to-analog conversion means; a band filter with a high point in said tuning circuits, said mixing stage having an output connected downstream of said controlled high-frequency preamplifier stage to the high point of said band filter for automatic alignment of said band filter and simultaneous decontrol of said high-frequency preamplifier stage; said auxiliary oscillator being switched off when said preamplifier stage is controlled again and said tuner-oscillator frequency is increased half a difference frequency formed from said video-carrier intermediate frequency and said audio-carrier intermediate frequency; a preliminary filter circuit, increased tuning voltage produced during displacement of said tuner-oscillator frequency participating in alignment of said preliminary filter circuit so that an audio-carrier frequency of the channel to be received serves as an auxiliary frequency and said audio-carrier frequency is thereby aligned; means for switching thereafter said tuner-oscillator frequency back to a frequency intended for said tuner-oscillator by reduction in tuning voltage and simultaneously reducing thereby tuning voltage in said preliminary filter circuit by a same amount so that said preliminary filter circuit is tuned to the middle frequency of the channel to be received and said high-frequency band filter is switched back to correct alignment.

2. A method for automatically aligning a tuner of a television receiver comprising the steps of: providing high-frequency tuning circuits with capacity diodes and a controlled high-frequency preamplifier stage and an intermediate-frequency amplifier with a reference circuit having a resonance frequency; switching said resonance frequency to an arithmetic mean between a video-carrier intermediate frequency and an audio-carrier intermediate frequency during automatic alignment, maximum control voltage being a criterion for optimum alignment; switched on an auxiliary oscillator during automatic alignment; providing a tuner oscillator with a tuner-oscillator frequency; generating an auxiliary frequency with said tuner oscillator through a mixing stage corresponding to the arithmetic mean of a video-carrier frequency and an audio-carrier frequency from said tuner-oscillator frequency; applying tuning voltage sequentially in digital steps through digital-to-analog conversion means and said capacity diodes for automatic alignment, discontinuing increase in tuning-voltage values when a maximum control voltage is attained and retaining a detected tuning-voltage value in said digital-to-analog conversion means; providing a band filter with a high point in said high-frequency tuning circuits; transmitting an output of said mixing stage downstream of said controlled high-frequency preamplifier stage to the high point of said band filter for automatic alignment of said band filter, and decontrolling simultaneously said high-frequency preamplifier stage; switching off said auxiliary oscillator when said preamplifier stage is controlled again and increasing said tuner-oscillator frequency by half a difference frequency formed from said video-carrier intermediate frequency and said audio-carrier intermediate frequency; increased tuning voltage produced during displacement of said tuner-oscillator frequency participating in alignment of a preliminary filter circuit so that an audio-carrier frequency of the channel to be received serves as an auxiliary frequency and said audio-carrier frequency is thereby aligned; switching thereafter said tuner-oscillator frequency back to a frequency intended for said tuner-oscillator by reduction in tuning voltage and simultaneously reducing thereby tuning voltage in said preliminary filter circuit by a same amount so that said preliminary filter circuit is tuned to the middle frequency of the channel to be received, and switching back said high-frequency band filter to correct alignment.

* * * * *